(12) United States Patent
Kim et al.

(10) Patent No.: US 10,446,754 B2
(45) Date of Patent: Oct. 15, 2019

(54) FLEXIBLE ORGANIC LIGHT-EMITTING DIODE DISPLAY AND METHOD OF MANUFACTURING THE SAME

(71) Applicant: Samsung Display Co., Ltd., Yongin-si, Gyeonggi-do (KR)

(72) Inventors: Ki Hyun Kim, Daegu (KR); Sun Ho Kim, Seongnam-si (KR); Jeong Ho Kim, Seoul (KR); Hyun Woo Koo, Hwaseong-si (KR); Tae Woong Kim, Yongin-si (KR); Yeon Gon Mo, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 67 days.

(21) Appl. No.: 15/136,661

(22) Filed: Apr. 22, 2016

(65) Prior Publication Data

US 2016/0322565 A1 Nov. 3, 2016

(30) Foreign Application Priority Data

Apr. 30, 2015 (KR) ........................ 10-2015-0062085

(51) Int. Cl.
*H01L 51/52* (2006.01)
*H01L 51/56* (2006.01)
*H01L 51/00* (2006.01)
*H01L 27/32* (2006.01)

(52) U.S. Cl.
CPC ........ *H01L 51/003* (2013.01); *H01L 27/3248* (2013.01); *H01L 51/52* (2013.01); *H01L 51/5253* (2013.01); *H01L 51/56* (2013.01); *H01L 2227/323* (2013.01); *H01L 2227/326* (2013.01); *H01L 2251/301* (2013.01); *H01L 2251/5338* (2013.01)

(58) Field of Classification Search
None
See application file for complete search history.

(56) References Cited

U.S. PATENT DOCUMENTS

| 6,372,608 | B1 * | 4/2002 | Shimoda ............. G02F 1/13454 |
| | | | 257/E21.567 |
| 7,968,382 | B2 | 6/2011 | Jinbo et al. |
| 9,806,272 | B2 * | 10/2017 | Seo ...................... H01L 51/0097 |
| 2011/0059561 | A1 | 3/2011 | Liao et al. |
| 2013/0010731 | A1 | 1/2013 | Diener et al. |
| 2013/0020731 | A1 | 1/2013 | Kim et al. |

(Continued)

FOREIGN PATENT DOCUMENTS

| EP | 2 290 726 A1 | 3/2011 |
| JP | 2931297 B1 | 5/1999 |

(Continued)

OTHER PUBLICATIONS

Extended European Search Report dated Oct. 7, 2016 for European Patent Application No. EP 16 167 579.8.

*Primary Examiner* — Fernando L Toledo
*Assistant Examiner* — Valerie N Newton
(74) *Attorney, Agent, or Firm* — F. Chau & Associates, LLC

(57) ABSTRACT

A flexible organic light-emitting diode display and a method of manufacturing the same are disclosed. In one aspect, the display includes a substrate formed of a first material including a metal and an OLED formed over the substrate.

18 Claims, 8 Drawing Sheets

(56) References Cited

U.S. PATENT DOCUMENTS

| | | | | |
|---|---|---|---|---|
| 2014/0285914 A1* | 9/2014 | Sakano | ............... | G02B 5/20 |
| | | | | 359/892 |
| 2015/0044932 A1* | 2/2015 | Khachatryan | ......... | H01L 51/003 |
| | | | | 445/24 |
| 2015/0333221 A1* | 11/2015 | Bibl | .................. | G09F 9/301 |
| | | | | 257/88 |

FOREIGN PATENT DOCUMENTS

| KR | 10-1015844 B1 | 2/2011 |
|---|---|---|
| KR | 10-2013-0044626 A | 5/2013 |
| WO | WO 2008/084956 A1 | 7/2008 |

\* cited by examiner

FLEXIBLE ORGANIC LIGHT-EMITTING DIODE DISPLAY AND METHOD OF MANUFACTURING THE SAME

CROSS-REFERENCE TO RELATED APPLICATION

This application claims priority to and the benefit of Korean Patent Application No. 10-2015-0062085 filed in the Korean Intellectual Property Office on Apr. 30, 2015, the entire contents of which are incorporated herein by reference.

BACKGROUND

Field

The described technology generally relates to a flexible organic light-emitting diode display and a method of manufacturing the same.

Description of the Related Technology

An organic light-emitting diode (OLED) display is self-emissive, i.e., does not require a separate light source, unlike a liquid crystal display. Thus, an OLED display can be made thinner and lighter. Further, OLED technology has other favorable characteristics such as low power consumption, high luminance, and a fast reaction speed.

Generally, the OLED display includes a substrate, an OLED positioned on the substrate, and an encapsulation portion encapsulating the OLED together with the substrate.

Flexible OLED displays are manufactured by forming a substrate including a resin such as polyimide on a support substrate, forming an OLED on the substrate, and separating the substrate from the support substrate.

The above information disclosed in this Background section is only for enhancement of understanding of the background of the described technology and therefore it may contain information that does not constitute the prior art that is already known in this country to a person of ordinary skill in the art.

SUMMARY OF CERTAIN INVENTIVE ASPECTS

One inventive aspect relates to a flexible OLED display in which a manufacturing time and manufacturing costs are reduced, and a method of manufacturing the flexible OLED display.

Another aspect is a flexible OLED display in which occurrence of defects is suppressed during manufacturing, and a method of manufacturing the flexible OLED display.

Another aspect is a flexible OLED display whose manufacturing process is simplified, and a method of manufacturing the flexible OLED display.

Another aspect is a flexible OLED display including: a substrate including a first material including a metal; and an OLED positioned on the substrate.

A sublimated material including a second material including a metal that is the same as the metal included in the first material may be attached to a rear surface of the substrate.

The first material may have a melting point that is higher than a melting point of the second material.

The first material may be insoluble to a solvent dissolving the second material.

The metal may be molybdenum (Mo).

The second material may be metal oxide.

The first material may be molybdenum dioxide ($MoO_2$), and the second material may be molybdenum trioxide ($MoO_3$).

The first material may be molybdenum (Mo), and the second material may be molybdenum trioxide ($MoO_3$).

The metal may include one or more of molybdenum (Mo), titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Jr), zirconium (Zr), zinc (Zn), and osmium (Os).

The first material may be molybdenum dioxide ($MoO_2$).

The first material may be molybdenum (Mo).

The flexible OLED display may further include a thin film transistor positioned between the substrate and the OLED and connected to the OLED.

The first material may have a melting point that is higher than a melting point of a material constituting the thin film transistor.

The flexible OLED display may further include a buffer layer positioned between the substrate and the thin film transistor and including an inorganic material.

The flexible OLED display may further include a first protection film positioned at a lower side of the substrate; and a second protection film positioned at an upper side of the OLED.

A thickness of each of the first protection film and the second protection film may be larger than a total thickness of the substrate, the thin film transistor, and the OLED.

The first protection film and the second protection film may each include an organic material.

Another aspect is a method of manufacturing a flexible OLED display, including: forming a sacrificial layer on a support substrate; forming a substrate including a first material including a metal that is the same as a metal included in the sacrificial layer on the sacrificial layer; forming an OLED on the substrate; and sublimating the sacrificial layer to separate the substrate from the support substrate.

The sacrificial layer may include a second material including a metal that is the same as the metal included in the first material.

The first material may have a melting point that is higher than a melting point of the second material.

The method may further include washing the support substrate in which the sacrificial layer and the substrate are formed by using a solvent, in which the first material is insoluble to the solvent dissolving the second material.

The sublimating of the sacrificial layer to separate the substrate from the support substrate may be performed by radiating a laser beam through the support substrate on the sacrificial layer.

The method may further include attaching a first protection film to a lower side of the substrate and attaching a second protection film to an upper side of the OLED.

Another aspect is a flexible organic light-emitting diode (OLED) display, comprising: a substrate formed of a first material including a metal; and an OLED formed over the substrate.

The above flexible OLED display further comprises a sublimated material including a second material, wherein the second metal is formed of the same substance as the metal, wherein the substrate includes first and second surfaces opposing each other, wherein the first surface faces the OLED, and wherein the sublimated material is attached to the second surface of the substrate.

In the above flexible OLED display, the first material has a melting point greater than the melting point of the second material.

In the above flexible OLED display, the first material is insoluble to a solvent configured to dissolve the second material.

In the above flexible OLED display, the metal includes molybdenum (Mo).

In the above flexible OLED display, the second material includes metal oxide.

In the above flexible OLED display, the first material includes molybdenum dioxide (MoO2), wherein the second material includes molybdenum trioxide (MoO3).

In the above flexible OLED display, the first material includes molybdenum (Mo), wherein the second material includes molybdenum trioxide (MoO3).

In the above flexible OLED display, the metal includes one or more of molybdenum (Mo), titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Jr), zirconium (Zr), zinc (Zn), and osmium (Os).

In the above flexible OLED display, the first material includes molybdenum dioxide (MoO2).

In the above flexible OLED display, the first material includes molybdenum (Mo).

The flexible OLED display further comprises a thin film transistor (TFT) electrically connected to the OLED and interposed between the substrate and the OLED.

In the above flexible OLED display, the first material has a melting point that is greater than the melting point of a material included in the TFT.

The flexible OLED display further comprises a buffer layer formed of an inorganic material and interposed between the substrate and the TFT.

The flexible OLED display further comprises: a first protection film formed below the substrate; and a second protection film formed over the OLED.

In the above flexible OLED display the thickness of each of the first and second protection films is greater than the total thickness of the substrate, the thin film transistor, and the OLED.

In the above flexible OLED display the first and second protection films each are formed of an organic material.

Another aspect is a method of manufacturing a flexible organic light-emitting diode (OLED) display, comprising: forming a sacrificial layer including a metal over a support substrate; forming a substrate on the sacrificial layer, wherein the substrate is formed of a first material including the metal; forming an OLED over the substrate; and sublimating the sacrificial layer so as to separate the substrate from the support substrate.

In the above method, the sacrificial layer is formed of a second material including the metal.

In the above method, the first material has a melting point greater than a melting point of the second material.

The above method further comprises washing the support substrate in which the sacrificial layer and the substrate are formed in solvent, wherein the first material is insoluble to the solvent configured to dissolve the second material.

In the above method, the sublimating of the sacrificial layer is performed by radiating a laser beam on the sacrificial layer through the support substrate.

The above method further comprises attaching a first protection film to a lower side of the substrate and attaching a second protection film to an upper side of the OLED.

Another aspect is a flexible organic light-emitting diode (OLED) display, comprising: a substrate comprising a metal, wherein the substrate includes first and second surfaces opposing each other; an OLED formed over the first surface of the substrate; and a sublimated material comprising the metal and formed on the second surface of the substrate.

According to at least one of the disclosed embodiments, a flexible OLED display and a method of manufacturing the same having a reduced manufacturing time and manufacturing cost are provided.

Further, defects can be suppressed during the manufacturing, and a method of manufacturing the flexible OLED display.

DETAILED DESCRIPTION OF CERTAIN INVENTIVE EMBODIMENTS

Figure 1:
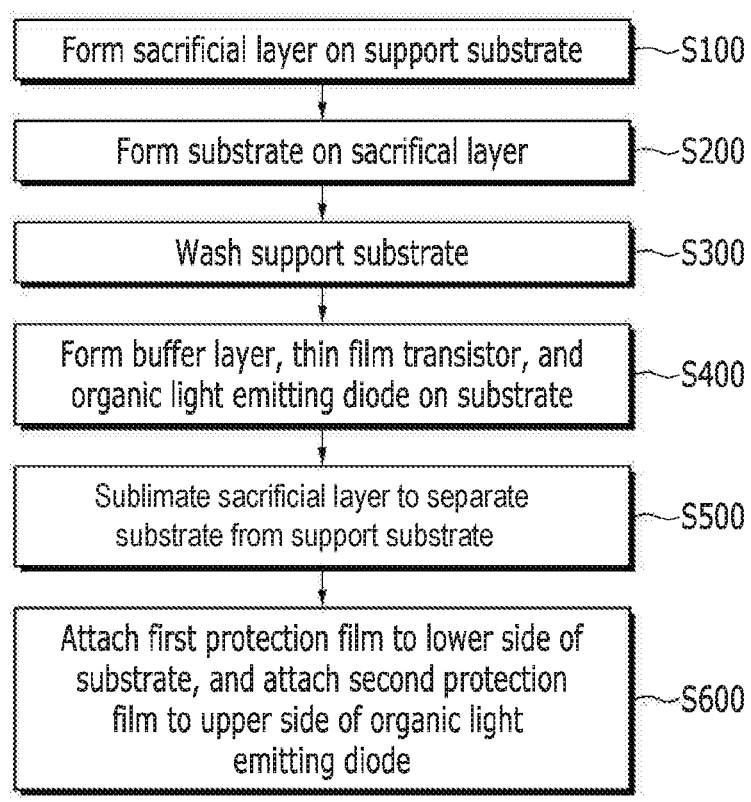
FIG. 1 is a flowchart illustrating a method of manufacturing a flexible OLED display according to an exemplary embodiment.

The described technology will be described more fully hereinafter with reference to the accompanying drawings, in which exemplary embodiments of the invention are shown so as to be easily understood by the person with ordinary skill in the art. As those skilled in the art would realize, the described embodiments may be modified in various different ways, all without departing from the spirit or scope of the described technology.

A part irrelevant to the description will be omitted to clearly describe the described technology, and the same elements will be designated by the same reference numerals throughout the specification.

In addition, the size and thickness of each configuration shown in the drawings are arbitrarily shown for understanding and ease of description, but the described technology is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction. In this disclosure, the term "substantially" includes the meanings of completely, almost completely or to any significant degree under some applications and in accordance with those skilled in the art. The term "connected" can include an electrical connection.

Hereinafter, a method of manufacturing a flexible OLED display according to an exemplary embodiment will be described with reference to FIGS. 1 to 6.

FIG. 1 is a flowchart illustrating a method for manufacturing a flexible OLED display according to an exemplary embodiment. Depending on embodiments, additional states may be added, others removed, or the order of the states changed in the procedure of FIG. 6. This also applies to the remaining disclosed embodiments. FIGS. 2 to 6 are cross-sectional views illustrating a method for manufacturing the flexible OLED display according to the exemplary embodiment.

Figure 2:
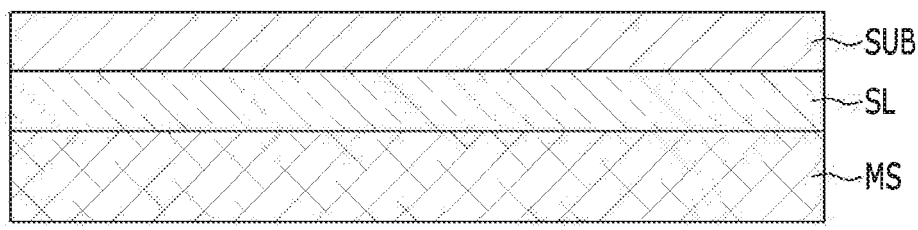
FIGS. 2, 3, 4, 5 and 6 are cross-sectional views illustrating a method of manufacturing the flexible OLED display according to the exemplary embodiment.

First, as illustrated in FIGS. 1 and 2, a sacrificial layer SL is formed on a support substrate MS (S100).

For example, the sacrificial layer SL is formed on the support substrate MS made of a glass, a metal, an inorganic material (ceramic), or the like. The sacrificial layer SL may be formed on the support substrate MS in a chamber by using a deposition process such as chemical vapor deposition (CVD) and sputtering. The sacrificial layer SL includes a second material including the metal. Herein, the metal may be molybdenum (Mo), and the second material may be molybdenum trioxide ($MoO_3$).

In another exemplary embodiment, the metal included in the second material included in the sacrificial layer SL may include one or more of titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Ir), zirconium (Zr), zinc (Zn), and osmium (Os), and the second material may include one or more of titanium oxide ($TiO_2$), aluminum oxide ($Al_2O_3$), tantalum oxide ($Ta_2O_5$), tungsten oxide ($WO_3$), copper oxide ($Cu_2O$), chromium oxide ($Cr_2O_3$), neodymium oxide ($Nd_2O_3$), iron oxide ($Fe_2O_3$), nickel oxide ($Ni_2O_3$), cobalt oxide (CoO), ruthenium oxide ($RuO_2$), rhodium oxide ($Rh_2O_3$), palladium oxide (PdO), iridium oxide ($IrO_2$), zirconium oxide ($ZrO_2$), zinc oxide (ZnO), and osmium oxide ($OsO_4$).

Next, a substrate SUB including a first material including a metal that is the same as a metal included in the sacrificial layer SL is formed on the sacrificial layer SL (S200).

The substrate SUB may be formed on the sacrificial layer SL in the same chamber where the sacrificial layer SL is formed by using the deposition process such as chemical vapor deposition (CVD) and sputtering. Since the substrate SUB is formed in the same chamber where the sacrificial layer SL is formed, an additional washing process for removing particles is not required. The substrate SUB includes the first material including a metal that is the same as the metal included in the sacrificial layer SL. Herein, the metal may be molybdenum (Mo), and the first material may be molybdenum dioxide ($MoO_2$) or molybdenum (Mo).

In another exemplary embodiment, the metal included in the first material included in the substrate SUB includes one or more of titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Jr), zirconium (Zr), zinc (Zn), and osmium (Os), and the first material may include one or more of titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Ir), zirconium (Zr), zinc (Zn), and osmium oxide ($OsO_2$).

The substrate SUB and the sacrificial layer SL include the first material and the second material that are different materials including the same metal, respectively. The first material included in the substrate SUB may have a melting point that is higher than that of the second material included in the sacrificial layer SL. Further, the first material included in the substrate SUB may be insoluble to a solvent dissolving the second material included in the sacrificial layer SL.

Next, the support substrate MS where the sacrificial layer SL and the substrate SUB are formed is washed by using the solvent (S300).

For example, in order to remove unneeded materials such as particles which may be positioned on the substrate SUB, the support substrate MS where the sacrificial layer SL and the substrate SUB are formed is washed by using the solvent. In this case, a portion of the sacrificial layer SL may be dissolved by the solvent, but since the substrate SUB includes the first material that is insoluble to the solvent dissolving the second material included in the sacrificial layer SL, unintended dissolving of a portion of the sacrificial layer SL by the solvent is suppressed.

Figure 3:
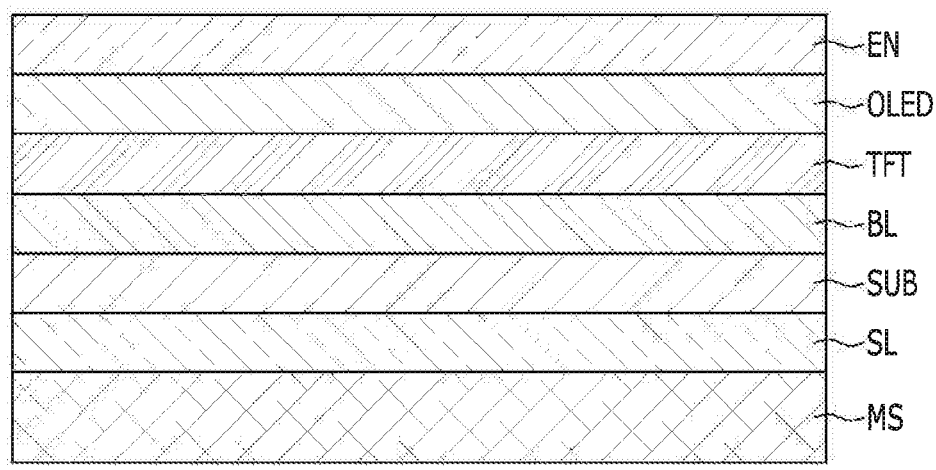

Next, as illustrated in FIG. 3, a buffer layer BL, a thin film transistor TFT, and an OLED are formed on the substrate SUB (S400).

For example, the buffer layer BL of a single layer or a plurality of layers formed of silicon oxide, silicon nitride, or the like is formed on the substrate SUB by using a deposition process, one or more thin film transistors TFT are formed on the buffer layer BL by using a MEMS technology such as a photolithography process, and a first electrode, an organic emission layer, and a second electrode are sequentially laminated on the thin film transistor TFT to form the OLED emitting light. Thereafter, an encapsulation portion (or encapsulation layer) EN is formed on the OLED. Herein, the encapsulation portion EN may have a form such as a thin film encapsulation portion or an encapsulation substrate but is not limited thereto, and may be formed in any form as long as the encapsulation portion encapsulates the OLED.

Further, while the buffer layer BL, the thin film transistor TFT, and the OLED are formed on the substrate SUB, the washing process using the solvent may be performed one time or more, but since the substrate SUB includes the first material that is insoluble to the solvent dissolving the second material included in the sacrificial layer SL, unintended dissolving of a portion of the sacrificial layer SL by the solvent is suppressed.

Further, since the first material included in the substrate SUB has a melting point that is higher than that of the second material included in the sacrificial layer SL, deformation of the substrate SUB by heat generated while the buffer layer BL, the thin film transistor TFT, and the OLED are formed on the substrate SUB is suppressed. For example, in the case where the second material included in the sacrificial layer SL is molybdenum trioxide ($MoO_3$) and the first material included in the substrate SUB is molybdenum dioxide ($MoO_2$), since the melting point of the second material is about 700° C. to about 900° C. but the melting point of the first material is about 1900° C. to about 2100° C., deformation of the substrate SUB by heat generated while the buffer layer BL, the thin film transistor TFT, and the OLED are formed on the substrate SUB is suppressed.

Figure 4:
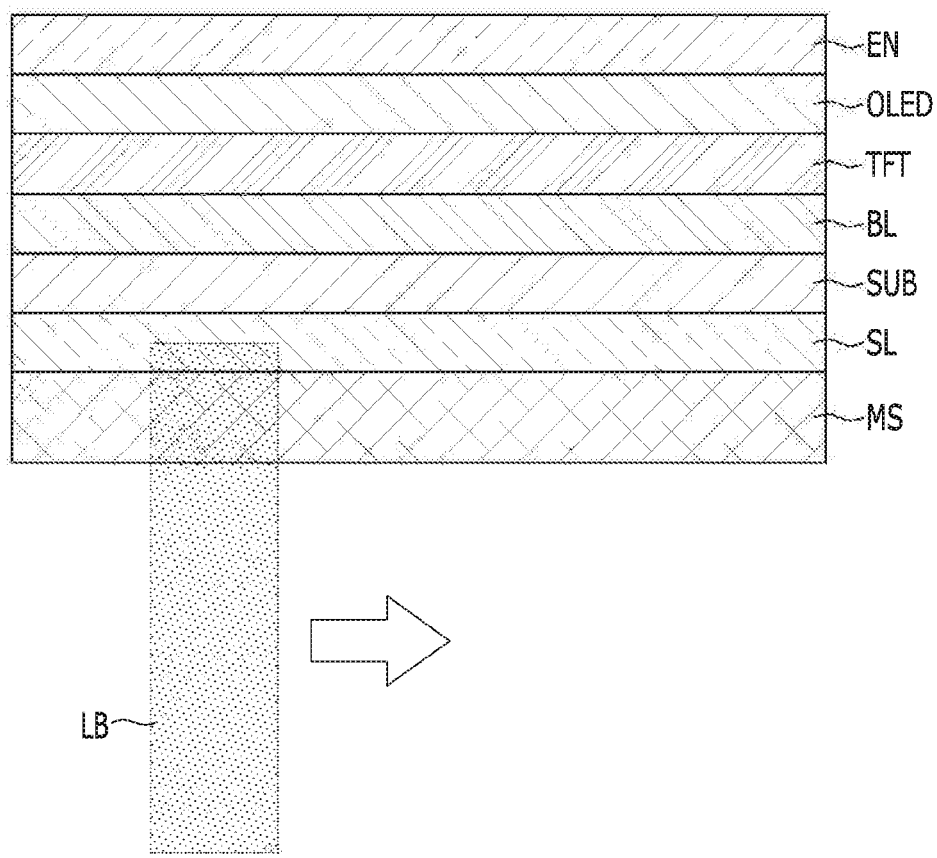
Figure 5:
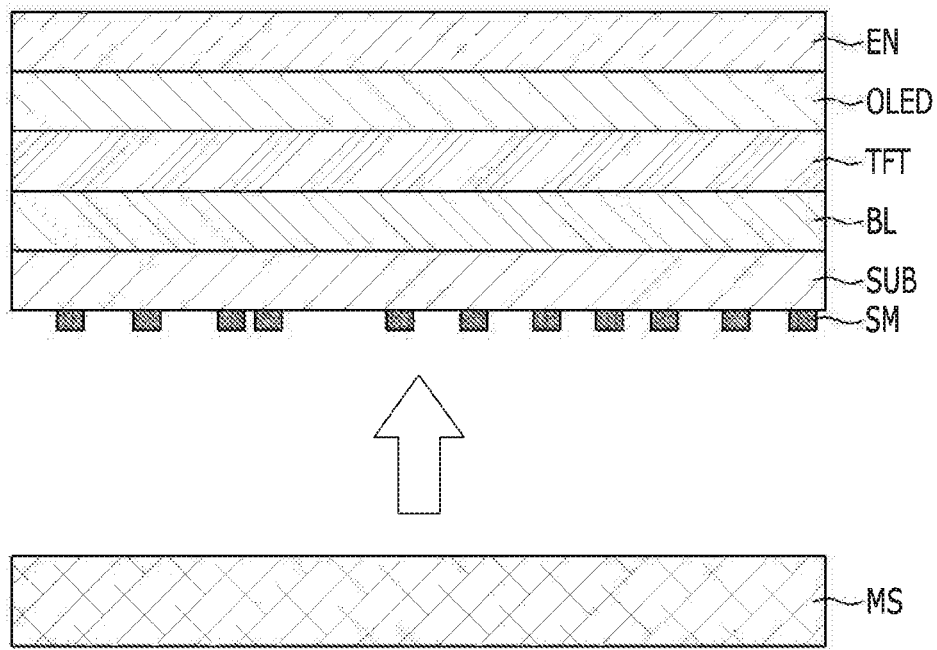

Next, as illustrated in FIGS. 4 and 5, the sacrificial layer SL is sublimated to separate the substrate SUB from the support substrate MS (S500).

For example, as illustrated in FIG. 4, a laser beam LB is radiated through the support substrate MS on the sacrificial layer SL to sublimate the sacrificial layer SL from a solid to a gas, and thus as illustrated in FIG. 5, the substrate SUB is separated from the support substrate MS. In this case, since the substrate SUB includes the first material having the melting point that is higher than that of the second material of the sacrificial layer SL, the substrate SUB is not deformed by the laser beam LB sublimating the sacrificial layer SL. A sublimated material SM sublimated from the gas to the solid is irregularly attached to a rear surface of the substrate SUB separated from the support substrate MS. The sublimated material may include the same second material as the sacrificial layer SL. By sublimating the sacrificial layer SL, hexavalent positive ions ($Mo^{6+}$) of molybdenum may be detected at the rear surface of the substrate SUB, but the ions are not limited thereto. In another exemplary embodiment, the sublimated material SM attached to the rear surface of the substrate SUB is removed.

As described above, by sublimating the sacrificial layer SL into the gas by using the laser beam LB to easily separate the substrate SUB from the support substrate MS, since static electricity is not generated while the substrate SUB is separated from the support substrate MS, breakage of the thin film transistor TFT by unintentionally generated static electricity is suppressed.

Figure 6:
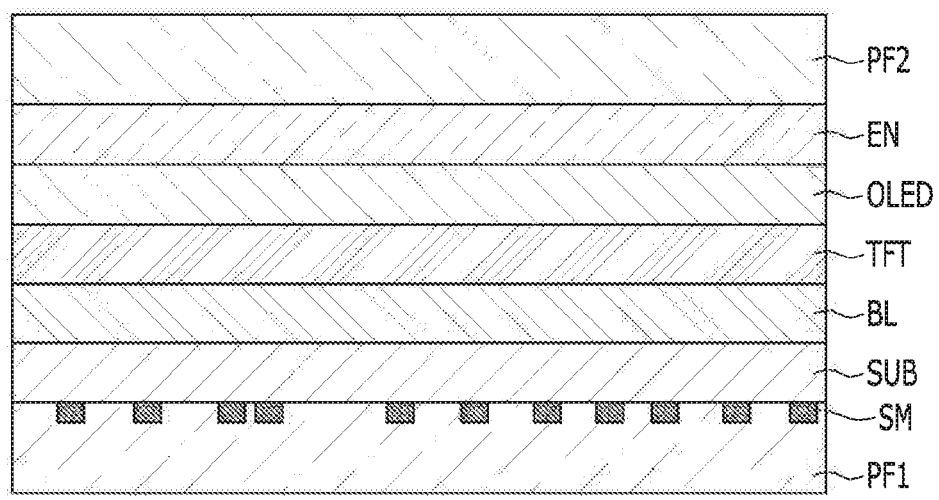

Next, as illustrated in FIG. 6, a first protection film PF1 is attached to a lower side of the substrate SUB, and a second protection film PF2 is attached to an upper side of the OLED (S600).

For example, the first protection film PF1 is attached to the rear surface of the substrate SUB positioned at the lower side of the substrate SUB, and the second protection film PF2 is attached to a front surface of the encapsulation portion EN positioned at the upper side of the OLED to manufacture the flexible OLED display. Each of the first protection film PF1 and the second protection film PF2 includes an organic material such as polyethylene terephthalate, polyimide, polycarbonate, epoxy, polyethylene, and polyacrylate, and may be flexible, stretchable, foldable, bendable, or rollable. Since each of the first protection film PF1 and the second protection film PF2 is flexible, stretchable, foldable, bendable, or rollable, the entire flexible OLED display may be flexible, stretchable, foldable, bendable, or rollable.

FIG. 6, for convenience of the description, illustrates that a thickness of each of the first protection film PF1 and the second protection film PF2 is less than a total thickness of the substrate SUB, the buffer layer BL, the thin film transistor TFT, the OLED, and the encapsulation portion EN, but the thickness is not limited thereto. The thickness of each of the first protection film PF1 and the second protection film PF2 may be about 5 times to about 50 times of the total thickness of the substrate SUB, the buffer layer BL, the thin film transistor TFT, the OLED, and the encapsulation portion EN.

As described above, in a method for manufacturing the flexible OLED display according to the exemplary embodiment, since the substrate SUB and the sacrificial layer SL include the first material and the second material including the same metal, respectively, the substrate SUB is formed in the same chamber where the sacrificial layer SL is formed, and thus an additional washing process for removing particles is not required. That is, after the sacrificial layer SL is formed, since the additional washing process for removing the particles is not required, there is provided the method for manufacturing the flexible OLED display where the total manufacturing time and manufacturing cost are reduced.

Further, in the method for manufacturing the flexible OLED display according to the exemplary embodiment, since the substrate SUB and the sacrificial layer SL include the first material and the second material including the same metal, respectively, the substrate SUB is formed in the same chamber where the sacrificial layer SL is formed. Thus, the support substrate MS where the sacrificial layer SL is formed does not need to be moved to another chamber in order to form the substrate SUB. That is, there is provided the method for manufacturing the flexible OLED display where the total manufacturing time and manufacturing cost are reduced.

Further, typically, a substrate including polyimide is used as the substrate of the flexible OLED display, but in the method for manufacturing the flexible OLED display according to the exemplary embodiment, since the substrate SUB includes molybdenum or molybdenum dioxide that is the first material including the same metal included in the sacrificial layer SL, an additional material and an additional process for forming the substrate including polyimide are not required. Accordingly, there is provided the method for manufacturing the flexible OLED display where the total manufacturing time and manufacturing cost are reduced.

Further, in the method of manufacturing the flexible OLED display according to the exemplary embodiment, since the substrate SUB including the first material that is insoluble to the solvent dissolving the second material included in the sacrificial layer SL covers the sacrificial layer SL, during the entire manufacturing process, even though the support substrate MS is washed by using the solvent in order to remove unneeded materials such as particles, unintended dissolving of a portion of the sacrificial layer SL by the solvent is suppressed. That is, there is provided the method for manufacturing the flexible OLED display where entire manufacturing reliability is improved.

Further, in the method of manufacturing the flexible OLED display according to the exemplary embodiment, by sublimating the sacrificial layer SL from the solid to the gas by using the laser beam LB to easily separate the substrate SUB from the support substrate MS, since static electricity is not generated while the substrate SUB is separated from the support substrate MS, breakage of the thin film transistor TFT by unintentionally generated static electricity is suppressed. That is, there is provided the method for manufacturing the flexible OLED display where entire manufacturing reliability is improved.

Further, in the method for manufacturing the flexible OLED display according to the exemplary embodiment, since the first material included in the substrate SUB has a melting point that is higher than that of the second material included in the sacrificial layer SL, deformation of the substrate SUB by heat generated while the buffer layer BL, the thin film transistor TFT, and the OLED are formed on the substrate SUB is suppressed. That is, since deformation of the substrate SUB according to a process temperature at which the buffer layer BL, the thin film transistor TFT, and the OLED are formed is suppressed, the process temperature of each of the buffer layer BL, the thin film transistor TFT, and the OLED is not limited by a temperature at which the substrate SUB is deformed. That is, there is provided the method for manufacturing the flexible OLED display where the entire manufacturing easiness is improved.

Hereinafter, a flexible OLED display according to another exemplary embodiment will be described with reference to FIGS. 7 and 8. The flexible OLED display according to another exemplary embodiment as will be described below may be formed by using the aforementioned method for manufacturing the flexible OLED display according to the exemplary embodiment but is not limited thereto, and the flexible OLED display may be formed by using another method for manufacturing an OLED display.

Figure 7:
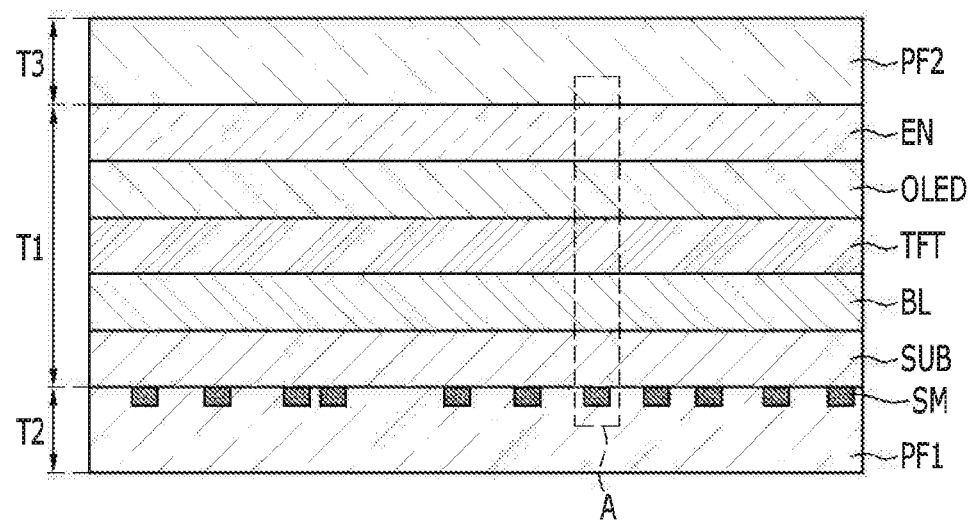
FIG. 7 is a cross-sectional view illustrating a flexible OLED display according to another exemplary embodiment.

FIG. 7 is a cross-sectional view illustrating the flexible OLED display according to another exemplary embodiment. FIG. 8 is a cross-sectional view specifically illustrating portion A of FIG. 7.

Figure 8:
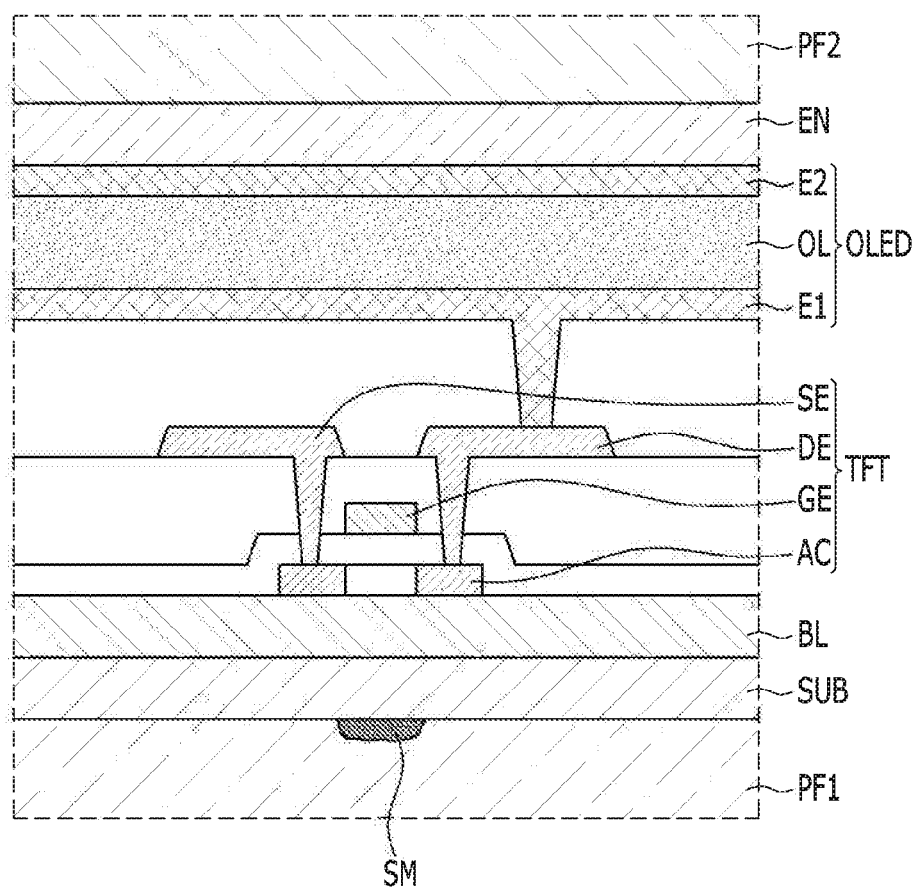
FIG. 8 is a cross-sectional view specifically illustrating portion A of FIG. 7.

As illustrated in FIGS. 7 and 8, a flexible OLED display 1000 according to another exemplary embodiment includes a substrate SUB, a sublimated material SM, a buffer layer BL, a thin film transistor TFT, an OLED, an encapsulation portion EN, a first protection film PF1, and a second protection film PF2.

The substrate SUB includes a first material including a metal that is the same as a metal included in the sublimated material SM attached to a rear surface of the substrate SUB. Herein, the metal may be molybdenum (Mo), and the first material may be molybdenum dioxide ($MoO_2$) or molybdenum (Mo).

In another exemplary embodiment, the metal included in the first material included in the substrate SUB may include one or more of titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Ir), zirconium (Zr), zinc (Zn), and osmium (Os), and the first material may include one or more of titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Jr), zirconium (Zr), zinc (Zn), and osmium oxide ($OsO_2$).

The first material included in the substrate SUB may have a melting point that is higher than that of the second material included in the sublimated material SM. For example, the melting point of the first material included in the substrate SUB may be about 1900° C. to about 2100° C., and the melting point of the second material included in the sublimated material SM may be about 700° C. to about 900° C.

Further, the melting point of the first material included in the substrate SUB may be higher than the melting point of each of constitutions constituting the thin film transistor TFT.

Further, the first material included in the substrate SUB may be insoluble to a solvent dissolving the second material included in the sublimated material SM.

Hexavalent positive ions ($Mo^{6+}$) of molybdenum may be detected at the rear surface of the substrate SUB, but the ions are not limited thereto.

The sublimated material SM is attached to the rear surface of the substrate SUB, and may be a material sublimated from a gas to a solid. The sublimated material SM includes a second material including a metal. Herein, the metal may be molybdenum (Mo), and the second material may be molybdenum trioxide ($MoO_3$) that is metal oxide.

In another exemplary embodiment, the metal included in the second material included in the sublimated material SM may include one or more of titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Ir), zirconium (Zr), zinc (Zn), and osmium (Os), and the second material may include one or more of titanium oxide ($TiO_2$), aluminum oxide ($Al_2O_3$), tantalum oxide ($Ta_2O_5$), tungsten oxide ($WO_3$), copper oxide ($Cu_2O$), chromium oxide ($Cr_2O_3$), neodymium oxide ($Nd_2O_3$), iron oxide ($Fe_2O_3$), nickel oxide ($Ni_2O_3$), cobalt oxide (CoO), ruthenium oxide ($RuO_2$), rhodium oxide ($Rh_2O_3$), palladium oxide (PdO), iridium oxide ($IrO_2$), zirconium oxide ($ZrO_2$), zinc oxide (ZnO), and osmium oxide ($OsO_4$).

As described above, in the case where the second material included in the sublimated material SM is molybdenum trioxide ($MoO_3$), the first material included in the substrate SUB may be molybdenum dioxide ($MoO_2$) or molybdenum (Mo).

In another exemplary embodiment, the sublimated material SM may not be attached to the rear surface of the substrate SUB, but in this case, hexavalent positive ions ($Mo^{6+}$) of molybdenum may be detected at the rear surface of the substrate SUB.

The buffer layer BL is positioned in a single layer or a plurality of layers including an inorganic material such as silicon oxide or silicon nitride on the substrate SUB. The buffer layer BL is positioned between the substrate SUB and the thin film transistor TFT.

The thin film transistor TFT is positioned between the substrate SUB and the OLED, and is connected to the OLED. Only one thin film transistor TFT is illustrated for convenience of the description, but the thin film transistor is not limited thereto, and the thin film transistor TFT may be connected to each of one or more scan wires, one or more data wires, a plurality of thin film transistors, and one or more capacitors, and the aforementioned constitutions may be connected to the thin film transistor TFT in various known structures.

The thin film transistor TFT includes an active layer AC, a gate electrode GE, a source electrode SE, and a drain electrode DE.

The active layer AC is positioned on the buffer layer BL, and may be formed of polysilicon or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

The active layer AC includes a channel region not doped with an impurity, and a source region and a drain region formed to be doped with the impurity at both sides of the channel region. Herein, the impurity is changed according to a type of thin film transistor, and an N type impurity or a P type impurity is feasible. In the case where the active layer AC is formed of the oxide semiconductor, a separate passivation layer may be added to protect the oxide semiconductor weak to an external environment such as exposure to high temperatures.

A gate electrode GE is positioned on the active layer AC, and a source electrode SE and a drain electrode DE are each positioned at an upper side of the gate electrode GE to be connected through contact holes to the source region and the drain region of the active layer AC, respectively.

In order to prevent a short-circuit between the active layer AC, the gate electrode GE, the source electrode SE, and the drain electrode DE that are constitutions of the thin film transistor TFT, one or more insulating layers are positioned between the constitutions of the thin film transistor TFT. The insulating layer includes an inorganic material such as silicon nitride or silicon oxide, and for example, the insulating layer may include one or more of SiNx, $Al_2O_3$, $SiO_2$, and $TiO_2$. The melting point of each of the active layer AC, the gate electrode GE, the source electrode SE, and the drain electrode DE that are constitutions of the thin film transistor TFT may be lower than that of the first material included in the substrate SUB.

The drain electrode DE of the thin film transistor TFT is connected to the OLED.

The OLED includes a first electrode E1 connected to the drain electrode DE of the thin film transistor TFT, an organic emission layer OL positioned on the first electrode E1, and a second electrode E2 positioned on the organic emission layer OL.

The first electrode E1 may be an anode that is a hole injection electrode, and may be any one electrode of a light reflective electrode, a light semi-transmissive electrode, and a light transmissive electrode. In another exemplary embodiment, the first electrode E1 may be a cathode that is an electron injection electrode.

The organic emission layer OL is positioned on the first electrode E1. The organic emission layer OL may be formed of a low molecular organic material or a high molecular organic material such as PEDOT (poly 3,4-ethylenedioxythiophene). The organic emission layer OL may include a red organic emission layer emitting red light, a green organic emission layer emitting green light, and a blue organic emission layer emitting blue light. The red organic emission layer, the green organic emission layer, and the blue organic emission layer are respectively formed in a red pixel, a green pixel, and a blue pixel to implement a color image. The organic emission layer OL may implement the color image by laminating all of the red organic emission layer, the green organic emission layer, and the blue organic emission layer in the red pixel, the green pixel, and the blue pixel together, and forming a red color filter, a green color filter, and a blue color filter for each pixel. In another example, as the organic emission layer OL, a white organic emission layer emitting white light may be formed in all of the red pixel, the green pixel, and the blue pixel, and the red color filter, the green color filter, and the blue color filter may be formed for each pixel to implement the color image. In the case where the color image is implemented by using the white organic emission layer as the organic emission layer OL and the color filter, a deposition mask for depositing the red organic emission layer, the green organic emission layer, and the blue organic emission layer in each pixel, that is, the red pixel, the green pixel, and the blue pixel may not be used. As an organic emission layer OL described in another example, of course, the white organic emission layer may be formed of one organic emission layer, and includes a constitution where white light may be emitted by laminating a plurality of organic emission layers. For example, the organic emission layer OL includes a constitution where white light can be emitted by combining at least one yellow organic emission layer and at least one blue organic emission layer, a constitution where white light can be emitted by combining at least one cyan organic emission layer and at least one red organic emission layer, a constitution where white light can be emitted by combining at least one magenta organic emission layer and at least one green organic emission layer, and the like.

The second electrode E2 is positioned on the organic emission layer OL, and may be a cathode that is an electron injection electrode. The second electrode E2 may be any one electrode of a light reflective electrode, a light semi-transmissive electrode, and a light transmissive electrode. The second electrode E2 may be positioned over the entire substrate SUB to cover the organic emission layer OL. In another exemplary embodiment, the second electrode E2 may be an anode that is a hole injection electrode.

The encapsulation portion EN is positioned on the substrate SUB while the buffer layer BL, the thin film transistor TFT, and the OLED are interposed therebetween. The encapsulation portion EN is positioned on the entire substrate SUB, and encapsulates the thin film transistor TFT and the OLED together with the substrate SUB. The encapsulation portion EN may be formed of a thin film encapsulation portion or an encapsulation substrate. In the case where the encapsulation portion EN is formed of the thin film encapsulation portion, the encapsulation portion EN may include an organic layer, and an inorganic layer positioned on the organic layer. For example, the encapsulation portion EN includes one or more organic layers and one or more inorganic layers alternately laminated, and for example, the inorganic layer or the organic layer each a plurality of layers, and a plurality of inorganic layers and a plurality of organic layers are alternately laminated. The encapsulation portion EN may include at least one sandwich structure in which at least one organic layer is inserted between at least two inorganic layers. The inorganic layer positioned at the uppermost layer of the encapsulation portion EN may be laminated in an area that is wider than that of the organic layer so as to cover an end of the organic layer that is another layer. The organic layer of the encapsulation portion EN is formed of a polymer, and preferably, may be a single layer or a laminated layer formed of any one of polyethylene terephthalate, polyimide, polycarbonate, epoxy, polyethylene, and polyacrylate. For example, the organic layer may be formed of polyacrylate, and for example, includes a matter obtained by polymerizing a monomer composition including a diacrylate-based monomer and a triacrylate-based monomer. Herein, a monoacrylate-based monomer may be further included in the monomer composition, and a known photoinitiator such as TPO may be further included in the monomer composition, but the monomer composition is not limited thereto. The inorganic layer of the encapsulation portion 500 may be a single layer or a laminated layer including metal oxide or metal nitride. For example, the inorganic layer may include one or more of $SiN_x$, $Al_2O_3$, $SiO_2$, and $TiO_2$. As described above, a second protection film PF2 and a first protection film PF1 are attached to a front surface of an upper side of the encapsulation portion EN and a rear surface of a lower side of the substrate SUB, respectively.

The first protection film PF1 and the second protection film PF2 protect the substrate SUB and the encapsulation portion EN, respectively, from external interference, and include an organic material such as polyethylene terephthalate, polyimide, polycarbonate, epoxy, polyethylene, and polyacrylate. FIG. 7, for convenience of the description, illustrates that a first thickness T1 that is a total thickness of the substrate SUB, the buffer layer BL, the thin film transistor TFT, the OLED, and the encapsulation portion EN is larger than each of a second thickness T2 of the first protection film PF1 and a third thickness T3 of the second protection film PF2, but the thickness is not limited thereto, and each of the second thickness T2 of the first protection film PF1 and the third thickness T3 of the second protection film PF2 may be larger than the first thickness T1 that is the total thickness of the substrate SUB, the buffer layer BL, the thin film transistor TFT, the OLED, and the encapsulation portion EN. For example, each of the second thickness T2 of the first protection film PF1 and the third thickness T3 of the second protection film PF2 may be 5 times to 50 times of the first thickness T1 that is the total thickness of the substrate SUB, the buffer layer BL, the thin film transistor TFT, the OLED, and the encapsulation portion EN.

Each of the first protection film PF1 and the second protection film PF2 may be flexible, stretchable, foldable, bendable, or rollable. Since each of the first protection film PF1 and the second protection film PF2 is flexible, stretchable, foldable, bendable, or rollable, an entire flexible OLED display 1000 may be flexible, stretchable, foldable, bendable, or rollable.

Further, in the flexible OLED display 1000 according to another exemplary embodiment, since the melting point of the first material included in the substrate SUB is higher than the melting point of each of constitutions constituting the thin film transistor TFT, during a manufacturing process, deformation of the substrate SUB by heat generated while the thin film transistor TFT is formed is suppressed. That is, since deformation of the substrate SUB by heat generated during the manufacturing process is suppressed, there is provided the flexible OLED display 1000 where reliability of itself of the product is improved.

Further, in the flexible OLED display 1000 according to another exemplary embodiment, since the substrate SUB includes molybdenum or molybdenum dioxide that is the first material including the metal, the first material included in the substrate SUB has a dense structure as compared to the organic material, and thus permeation of external moisture through the substrate SUB into the thin film transistor TFT or the OLED is suppressed. Therefore, since a life-span of each of the thin film transistor TFT and the OLED is improved, there is provided the flexible OLED display 1000 where a total life-span is improved.

Further, typically, a substrate including polyimide is used as the substrate of the flexible OLED display, but in the flexible OLED display 1000 according to another exemplary embodiment, since the substrate SUB includes the first material including molybdenum or molybdenum dioxide including molybdenum that is the metal having the dense structure as compared to polyimide, permeation of external moisture through the substrate SUB into the thin film transistor TFT or the OLED is suppressed. Therefore, since a life-span of each of the thin film transistor TFT and the OLED is improved, there is provided the flexible OLED display 1000 where the total life-span is improved.

While the inventive technology has been described in connection with what is presently considered to be practical exemplary embodiments, it is to be easily understood by those skilled in the art that the invention is not limited to the disclosed embodiments, but, on the contrary, is intended to cover various modifications and equivalent arrangements included within the spirit and scope of the appended claims.

What is claimed is:

1. A flexible organic light-emitting diode (OLED) display, comprising:
    a substrate including a first material including a first metal, wherein the substrate includes first and second surfaces opposing each other;
    an OLED disposed on the first surface of the substrate; and
    a sublimated material including a second material including a second metal and disposed on the second surface of the substrate,
    wherein the first metal and second metal are the same, and the substrate does not include organic material.

2. The flexible OLED display of claim 1, wherein the first material has a melting point higher than a melting point of the second material.

3. The flexible OLED display of claim 1, wherein the first material is insoluble to a solvent dissolving the second material.

4. The flexible OLED display of claim 1, wherein the first metal and the second metal include molybdenum (Mo).

5. The flexible OLED display of claim 4, wherein the second material includes metal oxide.

6. The flexible OLED display of claim 1, wherein the first material includes molybdenum dioxide (MoO2), and wherein the second material includes molybdenum trioxide (MoO3).

7. The flexible OLED display of claim 1, wherein the first material includes molybdenum (Mo), and wherein the second material includes molybdenum trioxide (MoO3).

8. The flexible OLED display of claim 1, wherein each of the first metal and the second metal includes one or more of molybdenum (Mo), titanium (Ti), aluminum (Al), tantalum (Ta), tungsten (W), copper (Cu), chromium (Cr), neodymium (Nd), iron (Fe), nickel (Ni), cobalt (Co), ruthenium (Ru), rhodium (Rh), palladium (Pd), iridium (Ir), zirconium (Zr), zinc (Zn), and osmium (Os).

9. The flexible OLED display of claim 1, wherein the first material includes molybdenum dioxide (MoO2).

10. The flexible OLED display of claim 1, wherein the first material includes molybdenum (Mo).

11. The flexible OLED display of claim 1, further comprising a thin film transistor (TFT) electrically connected to the OLED and interposed between the substrate and the OLED.

12. The flexible OLED display of claim 11, wherein the first material has a melting point that is higher than a melting point of a material included in the TFT.

13. The flexible OLED display of claim 11, further comprising a buffer layer including an inorganic material and interposed between the substrate and the TFT.

14. The flexible OLED display of claim 11, further comprising:
    a first protection film disposed below the substrate; and
    a second protection film disposed over the OLED.

15. The flexible OLED display of claim 14, wherein the thickness of each of the first and second protection films is greater than the total thickness of the substrate, the thin film transistor, and the OLED.

16. The flexible OLED display of claim 14, wherein the first and second protection films each include an organic material.

17. A flexible organic light-emitting diode (OLED) display, comprising:
    a substrate comprising a metal, wherein the substrate includes first and second surfaces opposing each other;
    an OLED disposed on the first surface of the substrate; and
    a sublimated material comprising the metal and irregularly disposed on the second surface of the substrate,
    wherein the substrate does not include organic material.

18. A flexible organic light-emitting diode (OLED) display, comprising:
    a substrate only including a first material which is a first metal, oxide of the first metal, or a combination thereof, wherein the substrate includes first and second surfaces opposing each other;
    an OLED disposed on the first surface of the substrate; and
    a sublimated material including a second material including a second metal and disposed on the second surface of the substrate,
    wherein the first metal and second metal are the same.

* * * * *